United States Patent [19]

DiFrancesco et al.

[11] Patent Number: 5,199,487

[45] Date of Patent: Apr. 6, 1993

[54] ELECTROFORMED HIGH EFFICIENCY HEAT EXCHANGER AND METHOD FOR MAKING

[75] Inventors: Lawrence DiFrancesco, Hayward; Carlyle L. Helber, Jr., Fountain Valley, both of Calif.

[73] Assignee: Hughes Aircraft Company, Los Angeles, Calif.

[21] Appl. No.: 708,954

[22] Filed: May 31, 1991

[51] Int. Cl.$^5$ ............................................. F28F 3/00
[52] U.S. Cl. .................................. 165/168; 165/170; 165/80.4
[58] Field of Search ............... 165/166, 168, 170, 80.4; 204/3, 11, 9

[56] References Cited

U.S. PATENT DOCUMENTS

| | | | |
|---|---|---|---|
| 997,610 | 2/1911 | Feldkamp | 204/11 X |
| 2,024,521 | 12/1935 | Harrison | 204/11 X |
| 2,540,805 | 2/1951 | Beebe | 204/9 X |
| 2,859,509 | 11/1958 | Adams | 29/890.042 |
| 2,966,729 | 1/1961 | Dedrick | 29/890.042 |
| 3,435,504 | 4/1969 | Miller | 29/890.042 X |
| 4,253,520 | 3/1981 | Friedericy et al. | 165/166 |
| 4,938,280 | 7/1990 | Clark | 165/80.4 |

FOREIGN PATENT DOCUMENTS 142933  5/1920  United Kingdom ..................... 204/9

Primary Examiner—Allen J. Flanigan
Attorney, Agent, or Firm—Wanda K. Denson-Low

[57] ABSTRACT

Electroformed high efficiency heat exchanger structure (44) is created by micro-machining and plating methods by creating a form, making holes therein, plating all over including through the holes, machining the assembly to shape, and thereupon dissolving out the form to form the microchannel structure without burrs. Manifolds (40, 42) are attached. The heat exchanger structure is preferably used where compact and high heat rates or power density requirements are present.

21 Claims, 7 Drawing Sheets

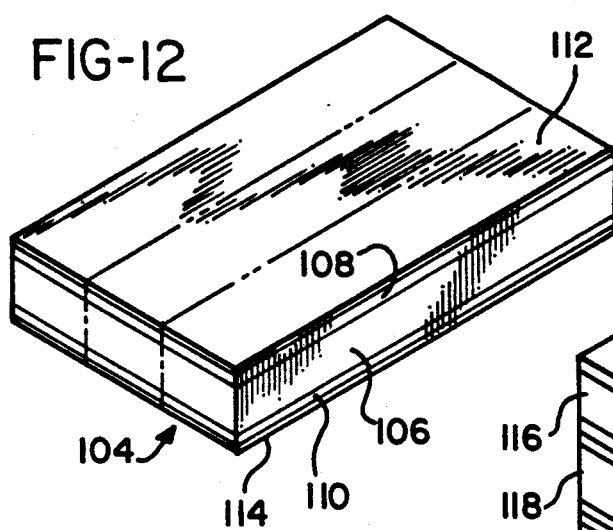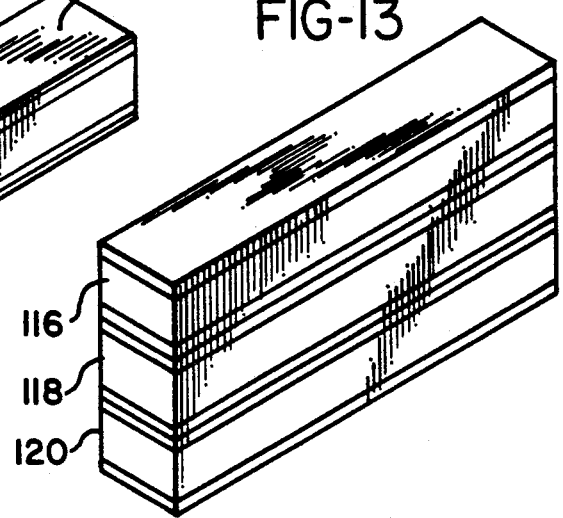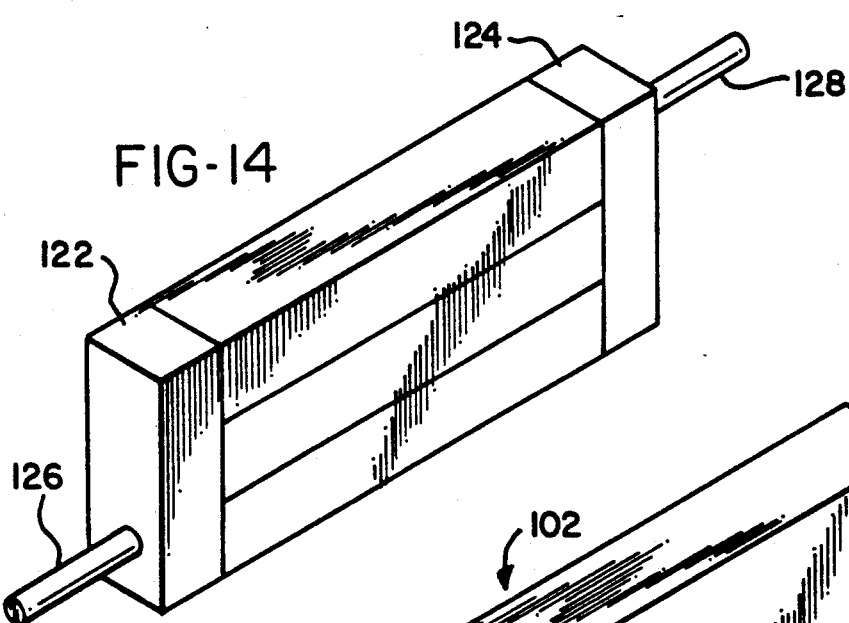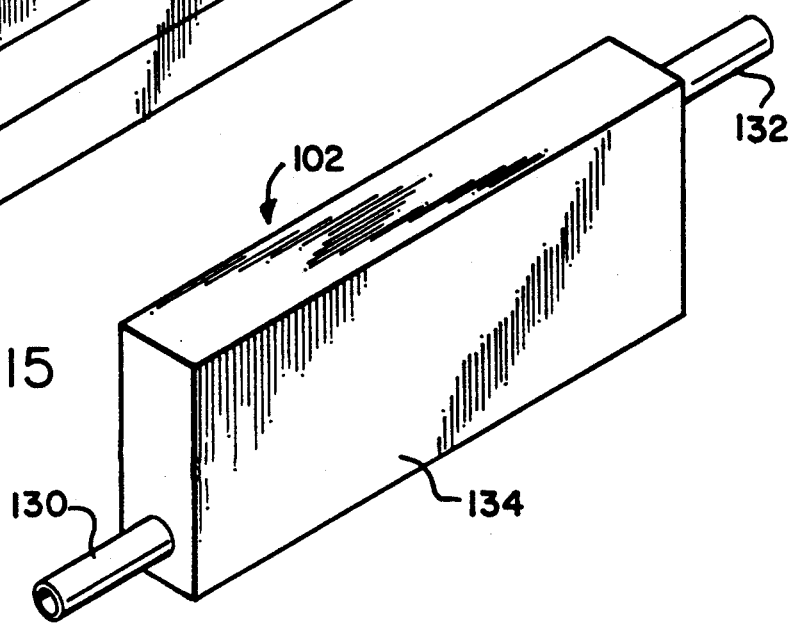

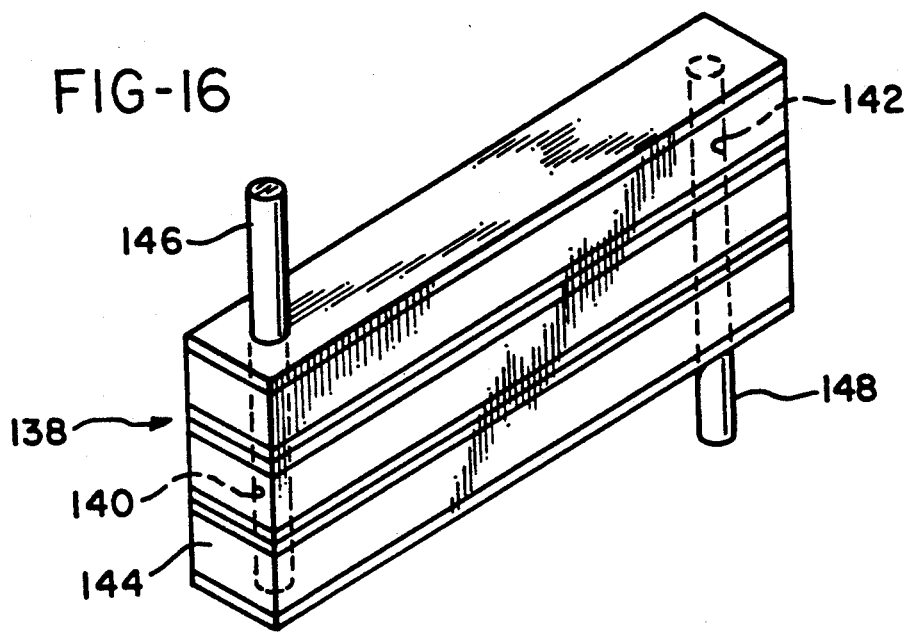
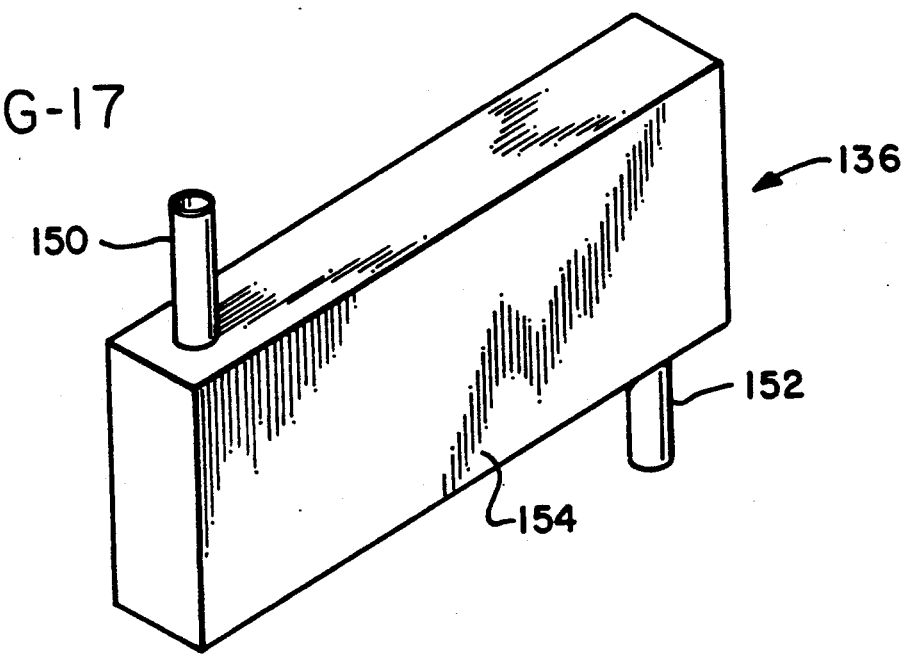

ELECTROFORMED HIGH EFFICIENCY HEAT EXCHANGER AND METHOD FOR MAKING

FIELD OF THE INVENTION

This invention is directed to an electroformed structure which provides small heat exchange passages which have high thermal capacity.

BACKGROUND OF THE INVENTION

The present state of the art in cooling techniques uses turbulent flow macro-channel exchangers. Present heat exchangers use fin spacing which is large with poor thermal transfer to coolant efficiency. Additionally, in cooling a heat source, the heat source is often separated from the heat exchanger by several thermal interfaces or is separated by poor thermally conductive materials such as thermal grease which results in poor heat transfer.

An important physical problem in computer systems is that of heat dissipation and removal. The heat generated by a single logic gate is small: at most a few milliwatts for most high-speed logic such as ECL (emitter coupled logic) and is much less for other logic families such as CMOS (complementary metal oxide semiconductors). However, when VSLI (very large scale integrated circuit) systems are fabricated with tens or hundreds of thousands of gates on a single chip, the total power consumption could conceivably reach the kilowatt level if high-performance logic is used. Even if a low-power logic family is used, a complete high-performance computer system might have $10^7$ to $10^8$ switching elements (e.g., transistors) and comprise hundreds of chips. If these chips are packed very closely together to minimize propagation delays, the problem of removing tens or (even hundreds) of kilowatts of heat while maintaining normal circuit temperatures (usually less than 120° C. Preferably even lower for enhanced reliability) from a system volume of less than 1 liter becomes challenging.

It has been widely considered that such a heatremoval task is effectively impossible. One pioneer of system physics has estimated that forced-air cooling of logic chips is limited to power densities of about 1 W/cm$^2$. and that liquid cooling is limited to about 20 W/cm$^2$. Another leader in high-speed Josephson systems has stated that, with present technology, it would be impossible to remove 20 kW from a room-temperature computer having a volume less than 640 cm$^3$, and that even a tenfold reduction in power to 2 kW would still present a "difficult, if not impossible" cooling task. Indeed, the best commercial technologies presently available for cooling density packed arrays of integrated circuits are the IBM Thermal Conduction Module and the Honeywell Silent Liquid Integral Cooler, both of which are limited to heat fluxes of about 20 W/cm$^2$.

Recently, efforts at Stanford University have been toward a new direction in the optimization of thermal equations. Such a heat exchanger structure was proposed by David Bazeley Tuckerman in his University of California doctoral thesis, of February 1984, entitled "Heat-Transfer Microstructures for Integrated Circuits" UCRL-53515. Tuckerman integrated a heat exchanger into a silicon device by etching grooves in the silicon. The concept and dimensions of that heat exchanger were derived by Tuckerman in his thesis. The process developed at Stanford University used small channels etched into silicon wafers. These small channels became heat transfer fluid flow channels. Such heat exchange structures are very efficient and take up minimal space. However, the placement of the heat transfer fluid flow channel in the silicon wafer presents problems because silicon is a poor thermal conductor and is brittle, thus very susceptible to breakage. The increased stress due to grooves in the silicon substrate of integrated circuits increases the possibility for breakage and, thus, decreases the reliability of the integrated circuit, especially in a shock environment.

Products which are weight-constrained and/or space-constrained and which have significant power dissipation are likely candidates for improvements in cooling capacity and size reduction. Airborne devices, missile devices, and torpedo devices are especially sensitive to size and weight requirements making them good candidates for such improvement. Vehicle- and man-portable equipments are sensitive to weight and volume constraints, but have less emphasis on power density. Large computer and groundbased radars can benefit from improved cooling capacity and size reduction, provided the improved heat exchanger accomplishes its results at a sufficiently low cost when compared to present techniques. By using the microchannel structure of this invention for a heat exchanger, less material is required and smaller, lighter-weight cabinets and hardware can be realized.

SUMMARY OF THE INVENTION

In order to aid in the understanding of this invention, it can be stated in essentially summary form that it is directed to an electroformed high efficiency heat exchanger and the method for making the heat exchanger structure. The heat exchanger structure is made by shaping a form. The form is plated all over and is machined to shape to expose the edge of the form material. The form material is then removed by etching, melting, or solvent dissolution. The resultant structure is hollow with small passageways therethrough. The surfaces of the passageways are the negative impressions of the surfaces of the original form. Surface roughness controls the drag imparted to the heat transfer fluid which passes through the passageways and, thus, reduces heat transfer fluid flow rate which, in turn, affects the quantity of heat that the device can exchange and the fluid pumping power requirements. As a heat exchanger, the structure has extremely high thermal capacity. A plurality may be stacked.

It is, thus, a purpose and advantage of this invention to provide an electroformed microchannel structure which can serve as a heat exchanger which has high thermal density, which is useful for applications with high-density electronic packages or high-power dissipation of electronics. The improved heat transfer capability of the electroformed microchannel structure also results in a lower junction-to-ambient temperature rise and an increase in reliability of the system.

It is another purpose and advantage of this invention to provide a heat exchanger which is compatible with the environment to which military equipment is exposed and which employs metal deposition processes such as plating, vacuum deposition and etching systems which are approved by military production standards.

It is a further purpose and advantage of this invention to provide an electroformed heat exchanger structure which can be produced by standard factory equipment and processes and within easily achieved tolerances so as to result in a low-cost, high-performance microchannel structure which is useful as a heat exchanger.

Other purposes and advantages of this invention will become apparent from a study of the following portion of this specification, the claims and the attached drawings wherein:

BRIEF DESCRIPTION OF THE DRAWINGS

FIG. 12 is an isometric view of a block which is plated on both sides as a step in producing a third preferred embodiment of the heat exchanger.

FIG. 13 is an isometric view of strips cut from the block of FIG. 12 stacked together.

FIG. 14 is an isometric view of end manifolds attached to the stack of FIG. 13.

FIG. 15 is an isometric view of the assembly of FIG. 14 plated all over with the form etched out to provide a finished heat exchanger.

FIG. 16 is an isometric view of a fourth preferred embodiment of the heat exchanger of this invention, with a series of strips stacked together, as in FIG. 13, together with connection forming rods inserted therein.

FIG. 17 is an isometric view of the structure of FIG. 16, plated all over and with the forms etched out to create a finished heat exchanger.

DESCRIPTION OF THE PREFERRED EMBODIMENTS

Figure 1:
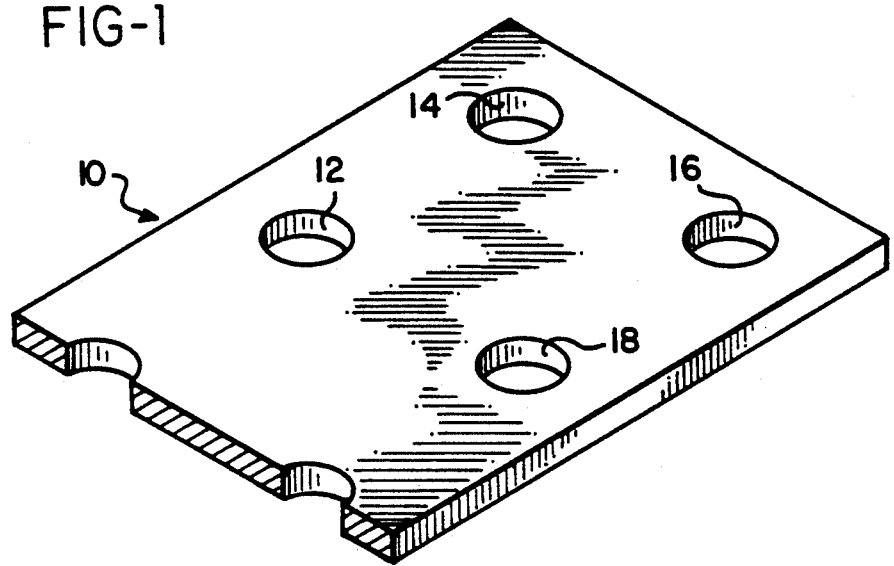
FIG. 1 is a isometric view of a form which serves as a starting piece for creation of the electroformed heat exchanger structure of this invention. The form may contain bends or other three dimensional shapes.

A description of how the electroformed heat exchanger structure is made will yield an understanding of both the method and the finished heat exchanger structure. Form 10, shown in FIG. 1, is the starting piece which defines the openings in the finished heat exchanger structure. Its size, shape and configuration define the ultimate spaces. The form 10 is made of a material which is machinable in the very general sense of the term. The material is machinable in the mechanical sense or is machinable by chemical etching, or by photo-printing an image followed by etching, or the like. In addition, the material must be removable later without damage to adjacent structure. Aluminum, zinc, cadmium, plateable solvent soluble polymer (wax), films, and sheets are suitable materials when the finished structure is made of conventional electroplating materials, such as copper, silver, gold, cobalt, iron, nickel, tin, lead, or tin/lead alloys. In the preferred embodiment, the material of the form 10 is aluminum, and aluminum is used as the preferred material in the following description. However, other materials are suitable, providing they fill the process needs of shapeability, plateability (including electroless plating), and removability without damage to the plated structure.

In a particular example of the structure shown in FIG. 1, the form 10 is of aluminum sheet 0.0010 inch thick. The range of aluminum sheet thickness can be from extremely thin, for example, 0.001 inch to such greater thickness as might be desired for structural reasons. The upper limit of thickness may be larger than 0.100 inch thick, but the upper limit is a function of the subsequent removability of the form. In this particular example, the form is a rectangular shape and has a plurality of throughholes at spaced intervals. The holes represent later created tubular posts between adjacent sheets. The posts are provided for strength and spacing purposes so their spacing is a function of the mechanical and thermal properties of the end material. As a specific example, the holes are 0.062 inch in diameter and are spaced 0.100 inch apart. The holes could be as small as structural plating will permit. This typically is about 10 percent of the material thickness or about 0.002 inch diameter minimum or the ability to machine, or photoimage/etch holes in form 10 of FIG. 1. Small drills are typically 0.010 inch diameter and could create a hole in form 10 that has a thickness five times this diameter, or about 0.050 inch thick. Photoimageing/etching under the best of conditions will produce an hourglass-shaped hole where the entrance of the hole will be roughly two times one/half the material thickness of form 10. Thus, machining might be able to produce a hole about 0.010 inch diameter through form 10 thickness of 0.050 inch. Photoimage and etching might produce a hole 0.025 inch diameter at the entrance, tapering to minimal diameter at the center of form 10 thickness and again becoming 0.025 inch diameter at the exit for a form having a thickness of 0.050 inch. Such is considered the lower limit of hole size. Holes 12, 14, 16 and 18 are seen in FIG. 1. The form 10 represents a layer of the finished microchannel structure, which may be a single layer or a multiple layered structure.

The method of forming the single layer structure is first described and, thereafter, the method of forming the multiple layer structure is described. When the microchannel structure is to be used as a micro heat exchanger, the form is configured to match the heat exchanger volume where coolant will eventually flow. The number of fins and the orientation of the fins to the heat source is dependent on the structural, mechanical, fluid flow and thermal requirements. The fins may be parallel or orthogonal to the heat source. The creation of the form is accomplished by machining, as used in the general sense described above, a sheet of etchable material using any one of several standard high-speed methods such as NC drills for drilling printed wiring boards, or photolithography methods using photoresist and chemical milling, or some other high-speed method. The holes machined into the metal form will provide a connection between the two surfaces plated on opposite sides of the form. A plurality of such forms is produced.

Figure 2:
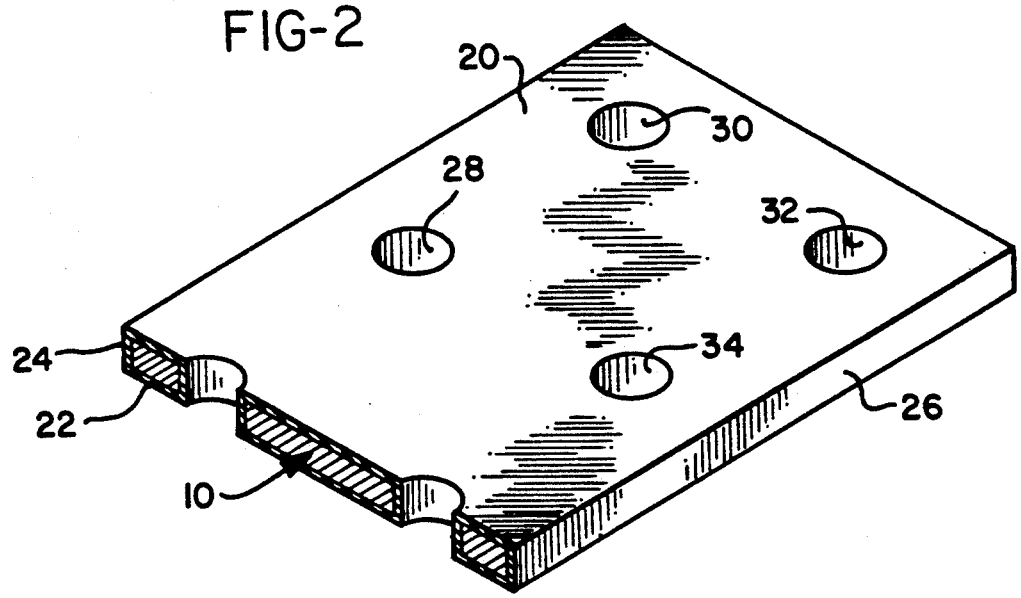
FIG. 2 is an isometric view thereof, showing the form plated, with parts broken away to show the plated layer.

Each form is plated all over with the desired metal or combinations of metal. Typically the following metals and their established known alloys such as nickel/cobalt are known to form structural plated metal deposits: nickel, copper, silver, gold, cobalt, iron, tin, and lead. All surfaces of the form will be plated. Where the form 10 is of a non-conductive material, the first metallic layer can be vacuum deposited, sprayed with a conductive paint, made electrically conductive by the well-known art of silver reduction spraying, or may be deposited by electroless plating. Holes in the form will form tubules between the front and rear plated surfaces. FIG. 2 shows top layer 20 of plated material and bottom layer 22 connected by plated metal on edges 24 and 26. The plated tubules corresponding to holes 12-18 are shown as tubules 28, 30, 32 and 34. When the plating is complete, the resulting stack is a solid block of metal with plated holes therethrough. The near and far ends are machined away to define cut end surfaces 36 and 38 shown in FIG. 3. With the presence of the form metal, the plated layers are machined without a burr being formed. Such burrs might block the small spacing between the plated layers, and such would reduce the heat transfer fluid flow and reduce device efficiency.

Figure 3:
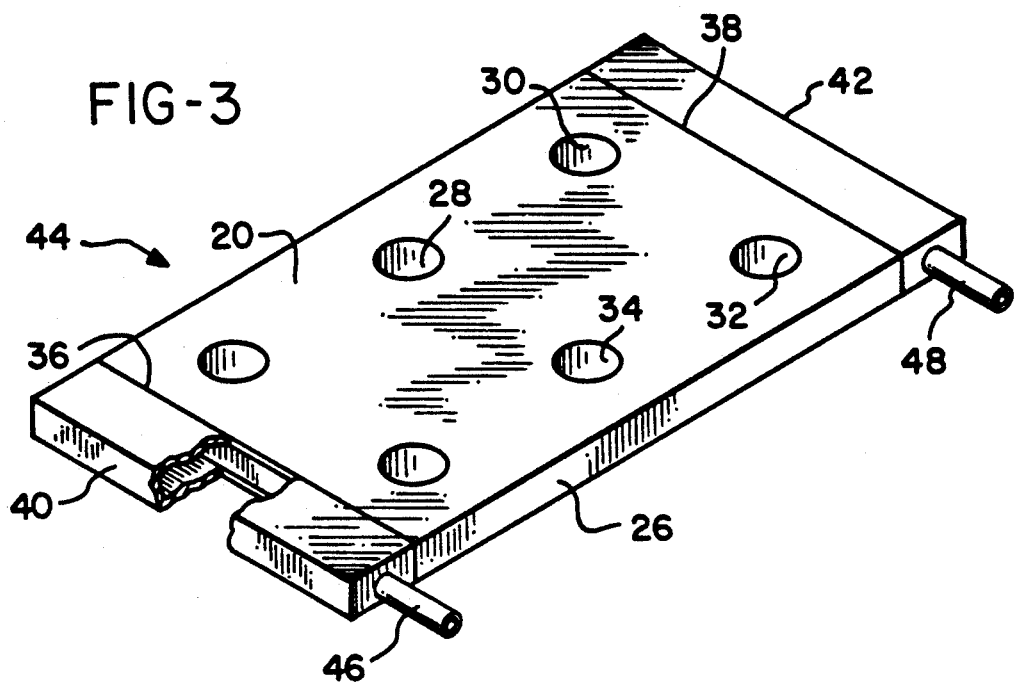
FIG. 3 is an isometric view of the heat exchanger, with the form etched out and manifolds attached.

Next, the aluminum form is dissolved away leaving a heat exchanger body. When the form material is aluminum, etching dissolution of the aluminum is accomplished by sodium hydroxide etching, or the like, so that the copper, nickel, silver, solder and/or braze materials plated on the form are unaffected. The etching out of the original form leaves the plated metal with small passageways for coolant flow, as seen in FIG. 3. The holes which are made in the original form are plated through to become posts which are structural spacers to support the cavity walls, and add rigidity to the device and act as thermal conduction transmitters to attached surfaces. The thickness of the original form 10 determines the separation between the heat exchanger walls. The surface finish of the original form defines the negative image of the surface finish of the ultimate heat exchanger fin.

The surface can be made very smooth. Reducing the surface roughness reduces the coolant's friction coefficient and the required coolant pumping power. Such a smooth surface permits more rapid laminar flow which, in turn, increases the ability of the heat exchanger to transfer heat. This increases the system's thermal transfer efficiency. The machined end surfaces 36 and 38 represent the finished edges of the heat exchanger to which covers or manifolds 40 and 42 will be attached so that heat transfer fluid can enter and leave the heat exchanger. The manifolds have tubes 46 and 48 which permit the connection of external plumbing for control of heat exchange fluid. The input and output manifolds 40 and 42 may be attached at this time by any convenient method without concern of blocking the coolant channels. Heat exchanger 44 is thus created.

Figure 4:
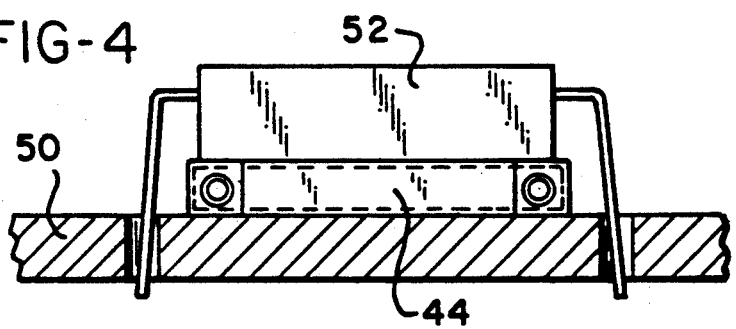
FIG. 4 shows the heat exchanger of FIG. 3 positioned between an integrated circuit package and a printed wiring board.
Figure 5:
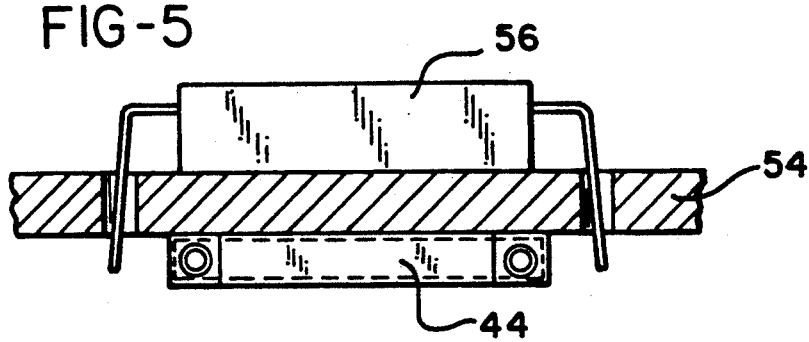
FIG. 5 is similar to FIG. 4, but shows the heat exchanger positioned on the opposite side of the printed wiring board from the integrated circuit package.

The heat exchanger can be plated directly onto the integrated circuit for the most intimate contact, or it can be attached by soldering, or a thermal transmission grease might be used for thermal contact. As seen in FIG. 4, mounted directly on the heat exchanger 44 is integrated circuit module 52, which is in the form of a flat pack with dual in-line pins. The pins extend through openings in the printed wiring board and are soldered to printed wiring circuitry adjacent the openings in conventional manner. The printed wiring may be either on the top or bottom of the board. Means must be taken to prevent electrical shorting of the printed wiring board circuitry via the metallic heat sink. This can be done either by interposing a dielectric layer or creating a circuitry design that will not contact the heat exchanger 44. In this way, there is direct thermal contact between the heat exchanger 44 and the module 52. This is the optimum arrangement of parts for maximum heat removal. When the maximum heat removal is not necessary, the heat exchanger may be positioned on the opposite side of the printed wiring board from the integrated circuit module, as shown in FIG. 5. In FIG. 5, the printed wiring board 54 carries an integrated circuit module 56 on one side and the heat exchanger 44 on the other side. As previously described with respect to module 52, the module 56 has its pins connected to the printed wiring circuitry on the printed wiring board by passing through openings in the printed wiring board and by soldering of the pins to printed wiring on the board. A single layer heat exchanger of this nature is usually sufficient for an ordinary integrated circuit module, as described.

Figure 6:
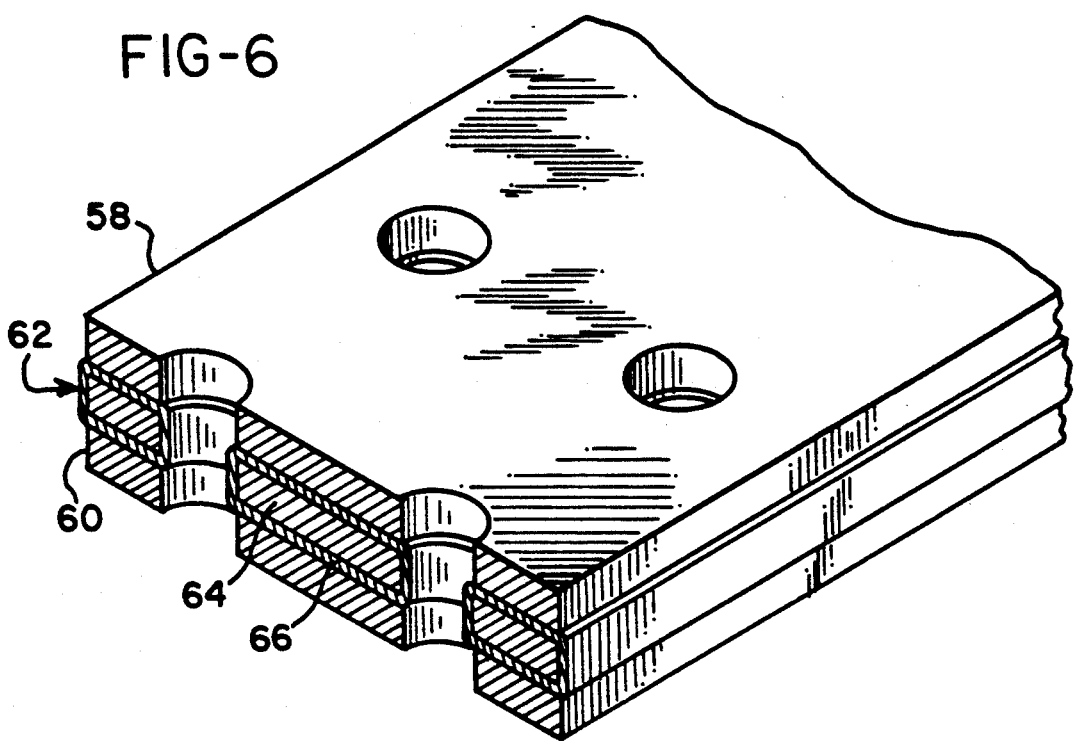
FIG. 6 shows a step in the process of making a multilayer heat exchanger, with the plated form of FIG. 2 laminated with two of the forms of FIG. 1, one above and one below.

Multiple layers of heat exchanger can also be accomplished in accordance with this invention. In FIG. 6, forms are stacked as an intermediate step in the process of forming a 3-layer heat exchanger. The top layer 58 is a form identical to the form 10 of FIG. 1, and the bottom layer form 60 is also identical to the form 10. The middle layer 62 has a form 64, which is also identical to the form 10. Previous to the assembly shown in FIG. 7, the middle layer form 64 has been plated all over, including through the holes, so it is like the plated form shown in FIG. 2. In this condition, the three layers are stacked. The stack is intimately held together with pins and/or cyanoacrylate adhesive, as described in Example 2. When the holes are in alignment for structural purposes, the stack is more rigid. In addition, the holes may be in alignment should secondary fluid flow therethrough be desired. When the holes are out of alignment, the stack is more resilient. While plating is a convenient attachment method, other ways may be employed to bond the layers together.

Figure 7:
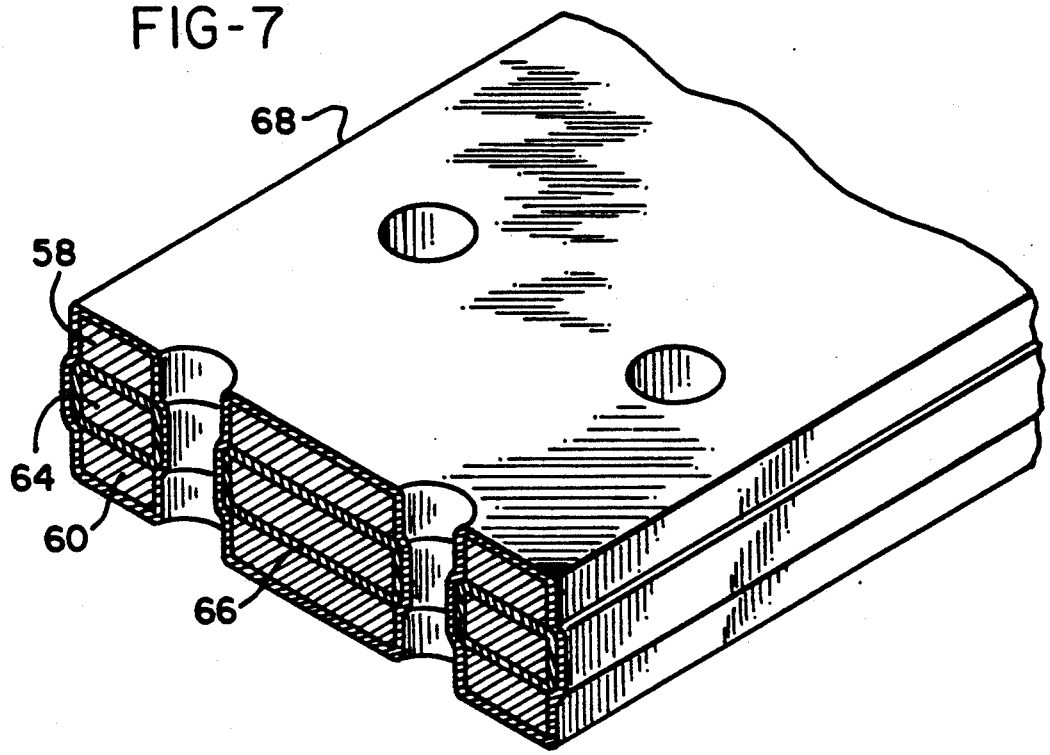
FIG. 7 is a view similar to FIG. 6 showing the forms plated all over.

If the forms are aluminum, the assembled forms are directly introduced into the plating bath in accordance with standard and well-known plating practices. If the forms are of non-conductive material, they are first coated with an electrically conductive material such as by electroless copper, electroless nickel, rubbed on an electrically conductive dust, such as silver or carbon dust or silver reduction spray and are thereafter placed in the electroplating bath and plated to the desired thickness. A first plating of nickel followed by a plating of copper to thickness is suitable. The overall plated layer is shown in FIG. 7. Both FIGS. 6 and 7 are sectional views showing the interior structure. The normal end cut would not be through the holes. Sections and not end cuts are indicated in FIGS. 1, 2, 6 and 7. The section lines are taken through the holes to show the plating through the holes. In FIG. 7, it is seen how the overall plated layer 68 covers the plated layer 66 in the holes and on the exterior surfaces. After plating is complete to the desired thickness, the ends are machined off and the forms removed, in the manner previously described for the single layer heat exchanger and in the examples. End manifolds are attached, and the result is a multiple layer heat exchanger. Should more than three layers be desired, it can be readily seen with respect to FIG. 6 that a plated form layer topped by an unplated form layer could be placed on the assembly of FIG. 6 to result in a 5-layer structure which would be treated in the same way. Thus, any desired thickness is available.

Figure 8:
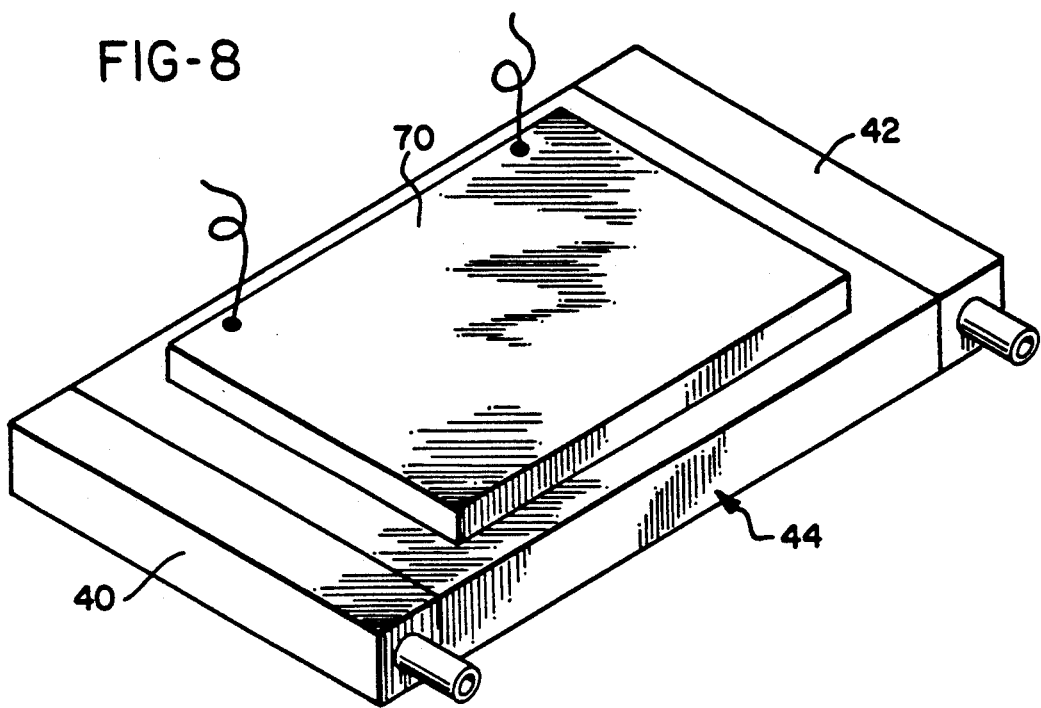
FIG. 8 is an isometric view of the completed heat exchanger of FIG. 3 or the heat exchanger completed from the step of FIG. 7 serving directly as a mounting plate for an integrated circuit package.

FIG. 8 illustrates heat exchanger 44 carrying an integrated circuit package 70 thereon, or the heat exchanger can be a multiple layer structure built from FIG. 7. The integrated circuit package is complete in itself with internal connections between a plurality of integrated circuit chips. Thus, no printed wiring board need be employed. In this way, the package is directly cooled without reference to a printed wiring board.

Figure 9:
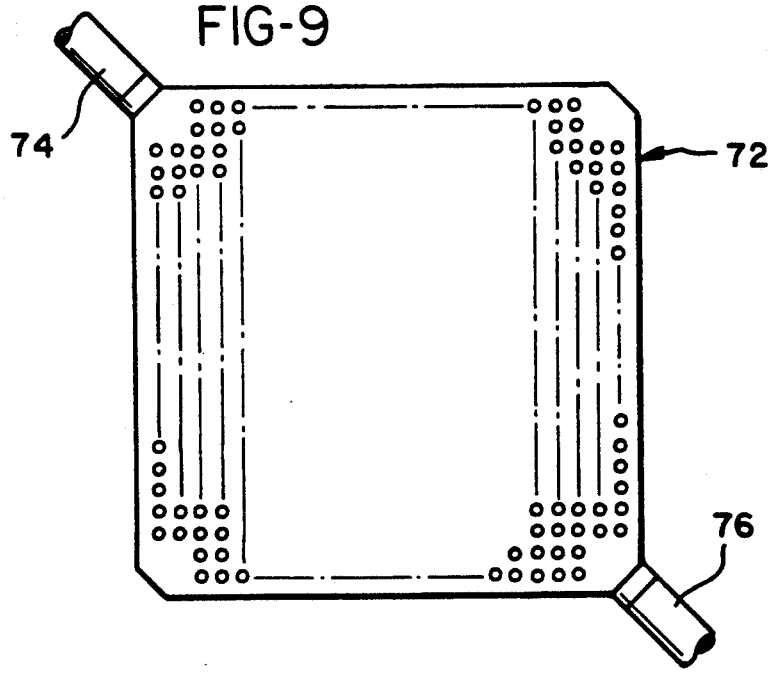
FIG. 9 is a plan view of a form which serves as the starting piece for creation of a second preferred embodiment of the electroformed heat exchanger, where the connection ports are integrally formed therewith.

FIG. 9 shows a form or mandrel 72 which is described in more detail in Example 1, below. Form 72 has rods or tubes 74 and 76 attached to the corners thereof on flats formed on the corners. These rods will serve as forms for the integral connection ports to the heat exchanger electroformed onto form 72.

EXAMPLE 1

The following fabrication sequence is an example of a method which can be used to fabricate, by nickel electroforming an integrated circuit package module multichannel single layer heat exchanger. The aluminum mandrel for the heat exchanger is shown in FIG. 9. This mandrel incorporates as a single unit the heat exchanger surface along with the manifolds and heat transfer media inlet/outlet ports. When complete, this electroform will accommodate a 1 inch by 1 inch integrated circuit module. Alternately, and with some adaptation, this heat exchanger can be incorporated as an integral part of the chip package which permits direct attachment of the semiconductor chips to the heat exchanger surface inside the package.

1. Fabricate an aluminum mandrel, as shown in FIG. 9. The heat transfer surfaces of this mandrel are 1 inch by 1 inch. The mandrel is 0.080 inch thick. Within the shown picture frame on the 1 inch by 1 inch heat transfer surface, drill 0.020 inch diameter holes through on 0.040 matrix. At opposing corners are the integral manifolds with input/output ports.
2. Mask off the end of the two port rods 74 and 76. Make plating electrical connections to the mandrel at these masked-off surfaces.
3. Nickel electroform, 0.005 inch thick all unmasked surfaces.
4. Remove the maskant.
5. Remove all of the aluminum mandrel by dissolving in sodium hydroxide. Approximately 100 gram/-liter sodium hydroxide at 125 degrees F works well. During etching, orient part so that etching gasses can escape.

The result is a multichannel; single layer, heat transfer media sealed, rigid, free-standing nickel electroform heat exchanger structure ready for attachment of the integrated circuit package module and connection of the heat transfer media inlet/outlet plumbing. This heat exchanger can be finish plated with gold, for example.

Figure 10:
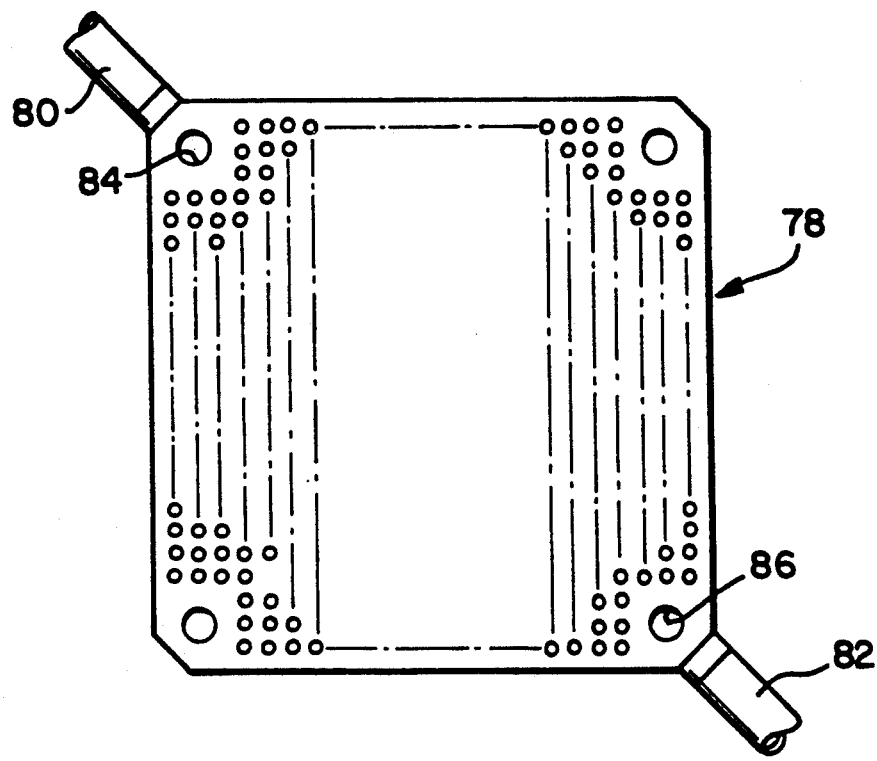
FIG. 10 is a plan view of another embodiment of a nickel electroformed heat exchanger which serves as a layer of a multilayer heat exchanger.
Figure 11:
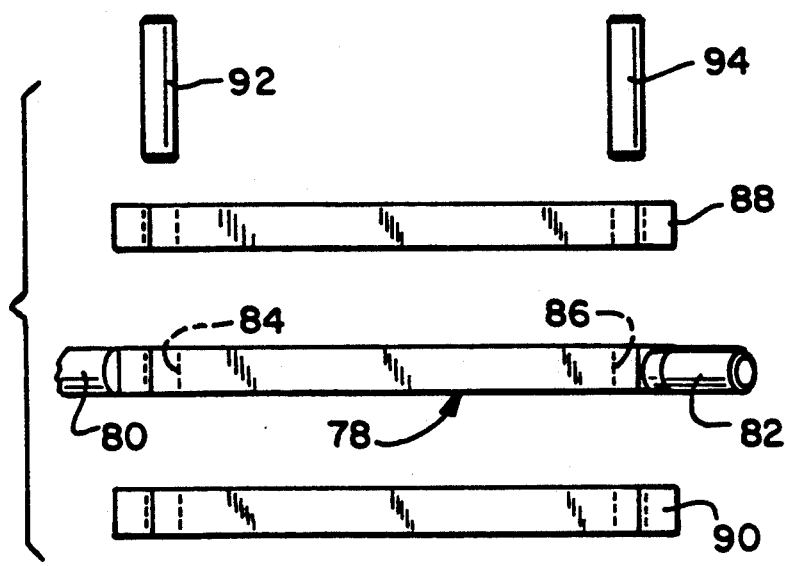
FIG. 11 is an exploded view showing the assembly of forms stacked with the heat exchanger of FIG. 10 to electroform a multilayer heat exchanger.

FIGS. 10 and 11 show a heat exchanger 78, which has ports 80 and 82 for connection thereto. The heat exchanger started with a mandrel 72 and was plated all over. The heat exchanger 78 still has the mandrel 72 therein. At least two holes 84 and 86 are drilled through the heat exchanger and mandrel. Upper and lower mandrels 88 and 90, see FIG. 11, are stacked on the heat exchanger 78 and are located thereon by means of aluminum press pins 92 and 94, which engage through the locating holes in the heat exchanger and the upper and lower mandrels. Thereupon, nickel is electroformed thereover and then the aluminum removed. The tops of the locating pins 92 and 94 are even with the top of mandrel 88, while the bottom of the pins are even with the bottom of mandrel 90 so that there is a smooth electroplate thereover. In addition to performing the locating functions, these press pins provide the fluid interconnection between the different layers of the final heat exchanger. Four such interconnecting channels are shown due to the four press pin openings shown in FIG. 10. More or less interconnection between the various layers of the multiple layer heat exchanger can be provided.

EXAMPLE 2

1. The following fabrication sequence can be used to fabricate a nickel electroformed integrated circuit package module multichannel multilayer heat exchanger. The primary aluminum mandrel for the heat exchanger is the same as shown in FIG. 9. FIG. 9 mandrel is fabricated as in Example 1 through step 3.
2. At this point, the 1 inch by 1 inch top and bottom nickel surfaces are machined flat and copper- or gold-plated so that a later nickel deposit can be adherently overplated in spite of the effects of the future processing.
3. The future cooling channels of the heat exchanger are now oriented in the desired direction, either parallel or orthogonal to the cooling surface. The cooling requirements and structural requirements will determine the cooling channel orientation.
4. Now quantity four 0.062 inch diameter holes are drilled through at opposing corners, as shown in FIG. 10.
5. Upper and lower aluminum mandrels 88 and 90, shown in FIG. 11, are then aligned with the 0.020 inch diameter holes in the primary mandrel and the 0.062 inch diameter holes. These upper and lower mandrels are press-pinned to the original nickel FIG. 10 mandrel with aluminum press fit pins and adhesively bonded in place at the faying surfaces. Cyanoacrylate adhesive is used for this bonding. Care is taken to remove squeezed-out adhesive. A nitromethane base solvent seems to work best to dissolve away squeezed-out adhesive without meaningful removal of the faying surface glue line. Machine the protruding pins to be flush with the top surfaces.
6. Prepare the assembly for plating using well-established and known plating practices. Nickel electroform 0.005 inch thick on all unmasked surfaces.
7. Remove the maskant.
8. Remove all of the aluminum mandrel, pins and cyanoacrylate lamination adhesive by dissolving in sodium hydroxide. Approximately 100 gram/liter sodium hydroxide at 125 degrees F. works well. During etching, orient part and apply a partial vacuum so that etching gasses can escape.

The result is a multichannel, multilayer, heat transfer media sealed, rigid, free-standing nickel electroform heat exchanger structure ready for attachment of the integrated circuit package module and connection of the heat transfer media inlet/outlet plumbing. This same package can be used to provide as many layers as is reasonable. A multichannel, multilayer heat exchanger can be made by adhering (soldering) together two or more Example 1 or 2 heat exchangers.

The heat exchanger 102, shown in FIG. 15, is made in a slightly different way in order to provide fins between the large opposing faces, as compared to the posts created by the structures and methods described above. Block 104 (see FIG. 12) starts as a plate 106 of the material which can be dissolved away, such as aluminum. It is plated all over with the material which forms the body of the heat exchanger, such as copper layers 108 and 110. Thereupon, it is plated all over with a layer of material which can provide for attachment, such as tin/lead solder. The attachment layers are indicated at 112 and 114. This plated block is trimmed to rectangular configuration, and strips are sliced therefrom. Strips 116, 118 and 120 are indicated in FIG. 13. The strips are stacked together, and with the application of heat and pressure, the solder plating is melted so as to fuse the strips together. The stack may be as high as 1 inch. As an alternate method, a plurality of the plated blocks 104 can be stacked and attached so as to make a stacked solid block measuring about 1 inch cube. From this cube, a slice such as shown in FIG. 13 is taken from one edge. All surfaces of the stack shown in FIG. 13 are machined to expose the edges of the copper fins. Next, manifolds 122 and 124, made of a base metal such as aluminum, are attached to the end of the stack. The manifolds include rods 126 and 128, which are also made of the base metal. Next, the assembly is plated all over and the base metal is dissolved out. Copper is a suitable material along with the others enumerated above. The layer applied is of such thickness as to be considered an electrodeposition. Thus, the heat exchanger 102 is completed with connector tubes 130 and 132 for connection to the supply of coolant. The large faces of the heat exchanger, such as the near face 134 and the opposite face (not seen in FIG. 15) are the faces intended for heat exchange. The faces may be as large as 1 inch by 1 inch in order to directly receive a large integrated circuit chip. In the heat exchanger 102, the fins are perpendicular to the large faces, such as face 134, and extends along the length of the heat exchanger between the ends with connectors 130 and 132.

The heat exchanger 136, shown in FIG. 17, is made in a very similar manner. The stack 138, shown in FIG. 16, is the same as the stack in FIG. 13. It may be made either by slicing off narrow strips, stacking them and fusing them, or may be made by stacking a series of plated blocks, such as block 104, fusing them and then slicing them. The stack 138 throughout its body has two plated layers held together by means of a suitable attachment. In a preferred example, the plated layers are copper on aluminum and the attachment is tin/lead solder. It is the manner in which fluid connections are made to the stack which is different. Holes 140 and 142 are drilled into the stack near its ends from opposite sides. The holes do not extend all the way through, but they extend into the last base metal layer in the last stacked strip. For hole 140, that means it extends into the base metal layer 144 without going through the bottom electrodeposited layer. The same is true for hole 142 in the upward direction. A base metal rod is pressed into each hole. Rod 146 is pressed into hole 140, and rod 148 is pressed into hole 142. It is understood that, when plated over, these rods will form tubes and, in order to strengthen the junction of the connector tubes to the heat exchanger, a conical transition piece may be placed on each rod lying against the assembly in order to create a stronger transition. When assembled, the assembly of FIG. 16 is plated over and the base metal dissolved out to result in the heat exchanger 136 with connectors 150 and 152. The large face 154 and its opposite face are the faces for heat exchange. The fins run perpendicular thereto. They may be sufficiently large for the direct attachment of an integrated circuit chip thereto.

EXAMPLE 3

The following fabrication sequence is an example of a method which can be used to fabricate by electroforming an integrated circuit package module multi-channel high efficiency heat exchanger.

1. A mandrel is formed as a flat sheet of aluminum approximately 1 inch by 1 inch by 0.005 inch thick. This sheet of aluminum is plated all over with at least 0.001 inch of copper and then overplated with at least 0.0002 inch of tin/lead solder.
2. These plated sheets are stacked together. The stack is preferably 1 inch high, which requires about 135 layers of plated aluminum sheets described above in Step 1.
3. The stack is now put into a press, and with the application of heat and pressure, the solder plating is melted so as to fuse the layers together. Upon cooling, the solder is allowed to solidify; and, upon removal from the press, the result is a stacked solid block measuring about 1 inch by 1 inch by 1 inch. One side of the block having the edges of the layers thereon is machined, and a slice about 0.100 inch thick is cut off to form a stack such as shown in FIGS. 13 and 16.
5. Two 0.050 inch diameter holes are drilled through all but the last plated metal layer at opposing ends, as shown in FIG. 16, and a slightly smaller aluminum rod is pressed into each of the holes with about 2 inches extending beyond the slab.
6. A brass cone with a 0.050 inch hole on the axis is mounted on each rod with its base to lie against the assembled stack. These spools are held in place with a cyanoacrylate adhesive and are of such configuration to assure a smooth external transition from the connector tube to the body of the heat exchanger.
7. The assembly is now plated all over with cooper or nickel to electrodeposit a layer to produce a metal assembly. The plating is done in such a manner that this overplate totally encapsulates the assembly with excellent structural integrity between assembly parts and has excellent adhesion to the metals making up the assembly. This encapsulating overplate should be at least 0.001 inch thick for structural reasons.
8. The encapsulating plating is optionally plated over for preservation or attachment. A gold plate can be used for preservation or a resolder plate could be used for attachment.
9. The ends of the aluminum rods are now opened to expose the aluminum inside the electroform.
10. The aluminum inside the electroform is completely removed, as described in Example 1. The result i a multi-channel, high efficiency heat exchanger approximately 1 inch by 1 inch on the large face and about 0.100 inch thick with integral tube connectors.

The heat exchangers which are described in Examples 1, and 3 can become part of the inside of an integrated circuit hybrid package. This is possible by making the heat exchanger part of the base of the package with the 0.020 inch diameter holes plugged with silver braze or attachment to the inside ceramic bottom of the package with the chip mounted directly to the heat exchanger. In this configuration, the tubing that contains the heat transfer media exits the package in such manner that package hermeticity is maintainable. The means of doing this are well known to hybrid circuit package designers.

This processing method is very useful for lightweight, thin-walled heat exchangers which provide optimum heat exchange surface by optimizing the passageway size. However, it is clear that the method is also useful in creating various structures in intricate shapes of hollow, thin-wall character.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A structure which is convertible into a microchannel heat exchanger structure:
    a unit, said unit having a plurality of layers and a connector between said layers, said layers each being of a metal plated on to a form of dissolvable material and said connector comprising electroplated structural metal, whereby said heat exchanger is formed by dissolving said form of dissolvable material.

2. The structure of claim 1 wherein said form is selected from the group consisting of aluminum, zinc, cadmium, and polymers.

3. The structure of claim 1 wherein said form is selected from the group consisting of aluminum, zinc, cadmium, and polymers and the structural metal plated thereon is selected from the group consisting of copper, silver, gold, tin, cobalt, iron, nickel, lead, solder and any other metal that can be electroplated to form self-sustaining structural electrodeposits.

4. The structure of claim 2 wherein there is a plurality of forms and adjacent layers are joined with metal which has been plated onto the forms.

5. The structure of claim 1 manifolds are attached to said structures so as to define the flow path between said layers substantially parallel to said layers so as to serve as a heat exchanger.

6. The structure of claim 5 wherein a printed wiring board is attached to one of said layers and a microelectronic device is mounted on said printed wiring board for cooling thereof.

7. The structure of claim 5 wherein an integrated circuit-containing package is mounted on one of said layers and a printed wiring board to which said package is connected is positioned against the other of said layers.

8. The structure of claim 3 manifolds are attached to said structures so as to define the flow path between said layers substantially parallel to said layers so as to serve as a heat exchanger.

9. The structure of claim 8 wherein a printed wiring board is attached to one of said layers and a microelectronic device is mounted on said printed wiring board for cooling of said microelectronic device.

10. The structure of claim 8 wherein an integrated circuit-containing package is mounted on one of said layers and a printed wiring board to which said package is connected is positioned against the other of said layers.

11. The structure of claim 4 manifolds are attached to said structures so as to define the flow path between said layers substantially parallel to said layers so as to serve as a heat exchanger.

12. The structure of claim 11 wherein a printed wiring board is attached to one of said layers and a microelectronic device is mounted on said printed wiring board for cooling thereof.

13. The structure of claim 11 wherein an integrated circuit-containing package is mounted on one of said layers and a printed wiring board to which said package is connected is positioned against the other of said layers.

14. A multichannel heat exchanger comprising:
    a first hollow body formed by layers and edges of structural plated metal;
    a second body lying against and attached to said first body, said second body being formed of structural plated metal with the structural plated metal of said second body extending around said structural plated metal of said first body, both said first and second bodies having openings therethrough to form tubules between their layers for supporting their layers.

15. The heat exchanger of claim 14 wherein said tubules of said first body are in alignment with said tubules of said second body so that said plated tubules extend through both said first and second bodies.

16. A structure convertible into a heat exchanger comprising:
    a first mandrel having faces which are large compared to thickness, said mandrel having a plurality of openings therethrough, metal electrodeposited on said first mandrel including three said openings therethrough;
    second and third mandrels of substantially the same size as said first mandrel, said second and third mandrels being made of dissolvable material, said second and third mandrels respectively lying against opposite faces of said first mandrel, said second and third mandrels each having a plurality of holes therethrough;
    at least two pens of dissolvable material extending through said first mandrel and at least into said second and third mandrels; and
    metal electrodeposited over all exterior surfaces of said first, second and third mandrels so that said dissolvable mandrels and pens may be dissolved out to form a heat exchanger.

17. The structure of claim 16 wherein said mandrel is selected from the group consisting of aluminum, zinc, cadmium, and polymers and the structural metal plated thereon is selected from the group consisting of copper, silver, gold, tin, cobalt, iron, nickel, lead, solder and any other metal that can be electroplated to form self-sustaining structural electrodeposits.

18. A structure convertible into a heat exchanger comprising:

a heat exchanger body and at least one manifold secured to said heat exchanger body for controlling fluid flow through said heat exchanger body, said heat exchanger body being formed of a stack of layers, each layer comprising a body of dissolvable material and a plated metal fin toward each adjacent layer together with a bonding material on each plated layer with said bonding material attaching adjacent layers so as to form a stack of layers, said manifold being made of dissolvable material and attached to said stack of layers so as to overlap a plurality of said layers;

an electrodeposited skin over said layers and said manifold so that said layers and said manifold can be dissolved out to form a heat exchanger of said electrodeposited skin and plated fins therein.

19. The structure of claim 18 wherein said dissolvable material is selected from the group consisting of aluminum, zinc, cadmium, and polymers and the structural metal plated thereon is selected from the group consisting of copper, silver, gold, tin, cobalt, iron, nickel, lead, solder and any other metal that can be electroplated to form self-sustaining structural electrodeposits.

20. A structure convertible into a heat exchanger comprising:

a plurality of layers stacked together, each of said layers comprising a body of dissolvable material with a plated metallic fin thereon facing the adjacent bodies and an attachment material between said fins so that said attachment material secures said stacked layers into a body;

walls defining at least two aligned openings substantially through said layers and dissolvable pins in said openings; and an electrodeposited structural metal layer over all external surfaces so that said dissolvable material can be dissolved away and said rods form connector tubes to the interior between said fins so as to complete a heat exchanger.

21. The structure of claim 20 wherein said dissolvable material is selected from the group consisting of aluminum, zinc, cadmium, and polymers and the structural metal plated thereon is selected from the group consisting of copper, silver, gold, tin, cobalt, iron, nickel, lead, solder and any other metal that can be electroplated to form self-sustaining structural electrodeposits.

* * * * *